(12) United States Patent
Jakobs et al.

(10) Patent No.: US 7,339,407 B2
(45) Date of Patent: Mar. 4, 2008

(54) DLL CIRCUIT FOR PROVIDING AN ADJUSTABLE PHASE RELATIONSHIP WITH RESPECT TO A PERIODIC INPUT SIGNAL

(75) Inventors: Andreas Jakobs, Munich (DE); Torsten Hinz, München (DE); Benaissa Zaryouh, Dallas, TX (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/360,988

(22) Filed: Feb. 23, 2006

(65) Prior Publication Data

US 2006/0197567 A1    Sep. 7, 2006

(30) Foreign Application Priority Data

Feb. 23, 2005   (DE)   .................... 10 2005 008 151

(51) Int. Cl.
*H03L 7/06*   (2006.01)
(52) U.S. Cl. ...................... 327/158; 327/277
(58) Field of Classification Search ................ 327/277, 327/276, 141–163
See application file for complete search history.

(56) References Cited

U.S. PATENT DOCUMENTS

| | | | |
|---|---|---|---|
| 5,796,673 A * | 8/1998 | Foss et al. ................... | 365/233 |
| 5,994,938 A * | 11/1999 | Lesmeister .................. | 327/277 |
| 6,720,810 B1 | 4/2004 | New | |
| 6,794,913 B1 | 9/2004 | Stengel | |
| 7,034,589 B2 * | 4/2006 | Chao .......................... | 327/158 |
| 7,078,950 B2 * | 7/2006 | Johnson ...................... | 327/158 |
| 7,202,719 B2 * | 4/2007 | Gabato et al. .............. | 327/158 |
| 2002/0141527 A1 | 10/2002 | Song | |
| 2006/0022737 A1 * | 2/2006 | Gregorius et al. .......... | 327/276 |
| 2006/0197566 A1 * | 9/2006 | Jakobs et al. ............... | 327/158 |

* cited by examiner

*Primary Examiner*—Tuan T. Lam
*Assistant Examiner*—Diana J Cheng
(74) *Attorney, Agent, or Firm*—Patterson & Sheridan, L.L.P.

(57) ABSTRACT

The invention relates to a DLL circuit for providing an adjustable time delay of a periodic input signal, said circuit having controllable delay elements which are connected in series and form a delay chain, having a phase detector in order to generate a control signal on the basis of the periodic input signal and a periodic signal which has been delayed by the delay chain, the delay of each of the delay elements being adjusted on the basis of the control signal, and having a selection unit which is respectively connected to one of the delay elements in order to apply an output signal from one of the delay elements to an output of the DLL circuit on the basis of a selection variable which has been provided, and a compensation circuit which modifies the selection signal such that an additional delay (which is caused at least by the selection unit) between the periodic input signal and the output signal from the DLL circuit is compensated for.

20 Claims, 3 Drawing Sheets

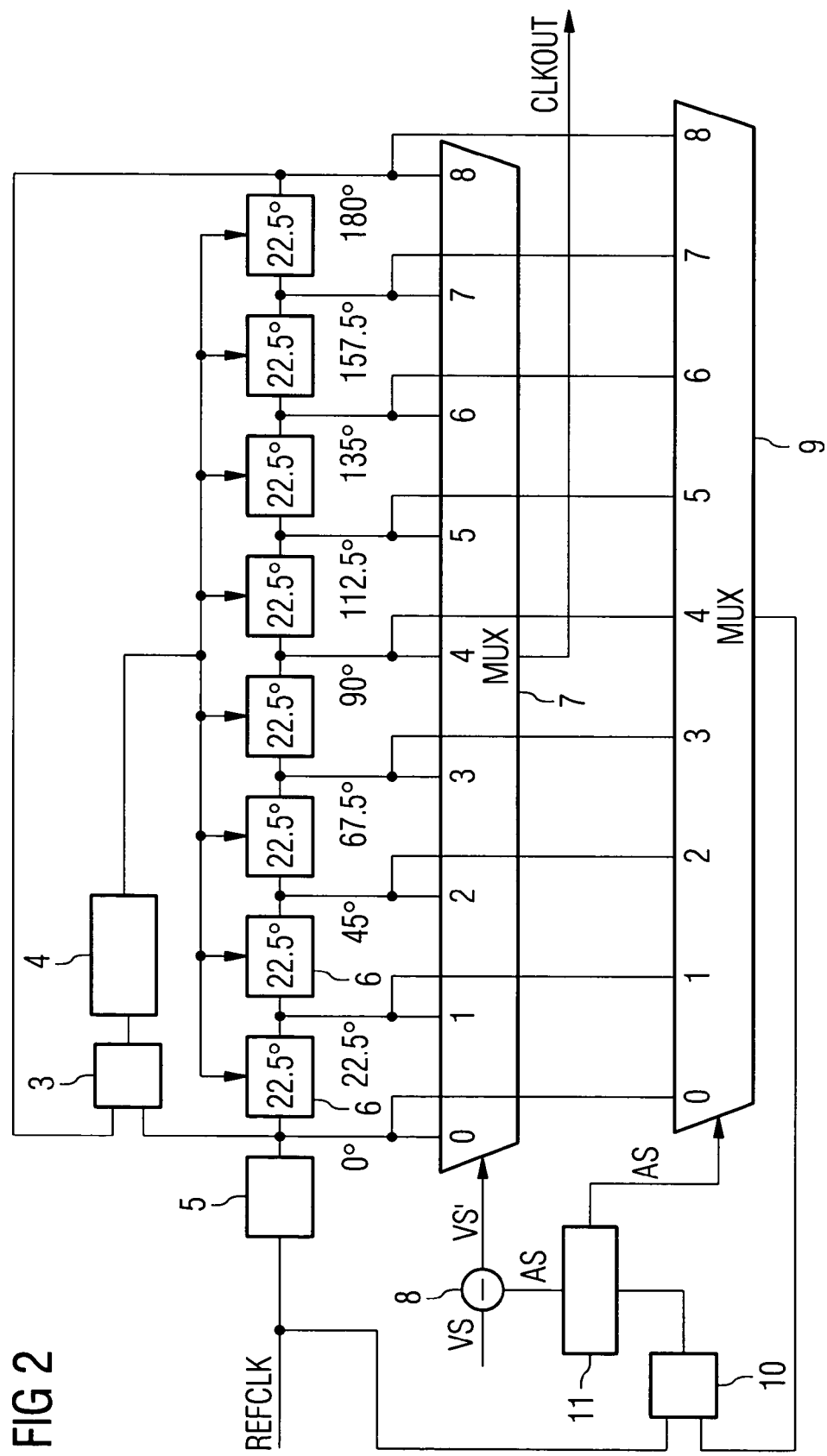

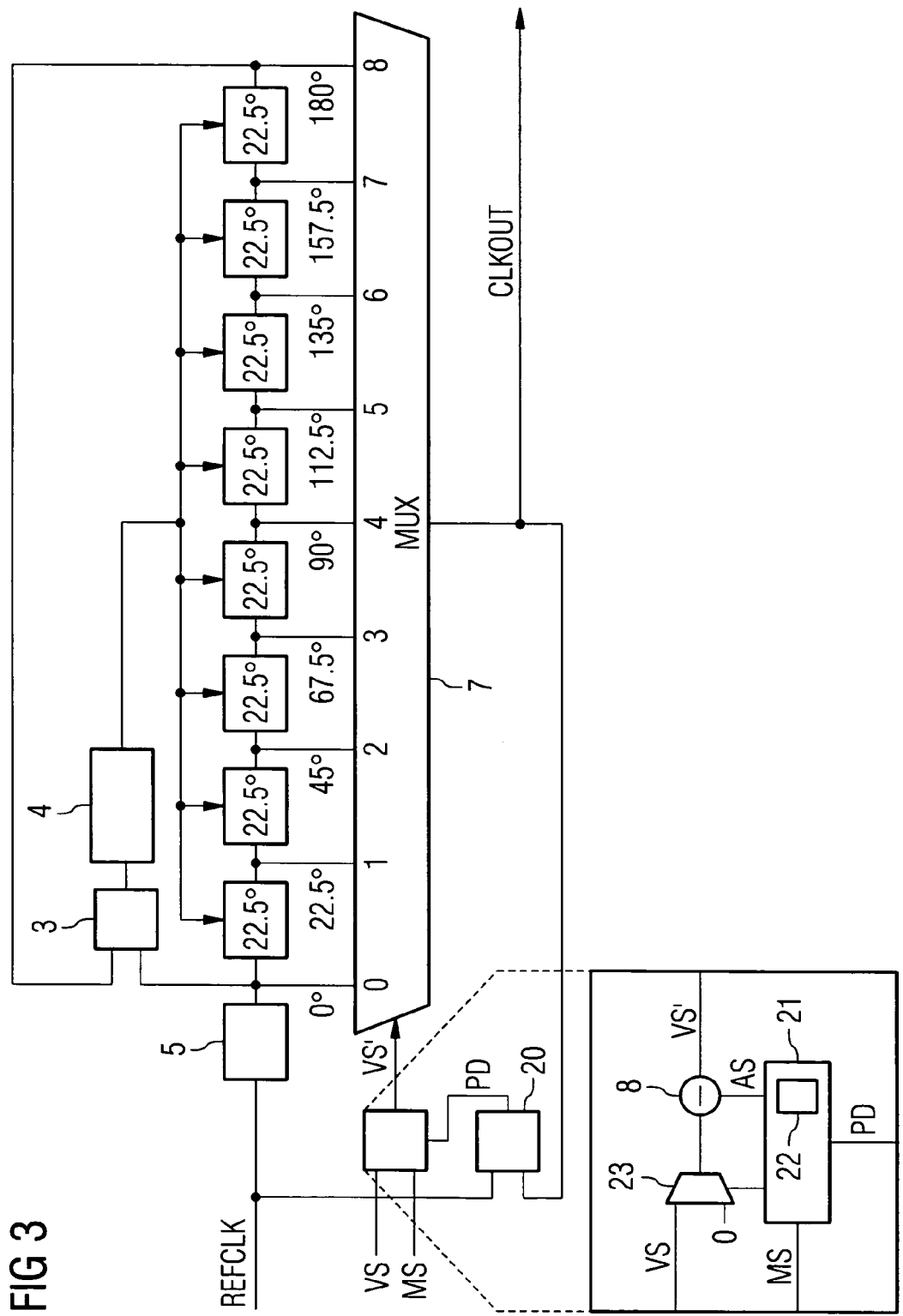

DLL CIRCUIT FOR PROVIDING AN ADJUSTABLE PHASE RELATIONSHIP WITH RESPECT TO A PERIODIC INPUT SIGNAL

CROSS-REFERENCE TO RELATED APPLICATIONS

This application claims foreign priority benefits under 35 U.S.C. § 119 to co-pending German patent application number DE 10 2005 008 151.7, filed 23 Feb. 2005. This related patent application is herein incorporated by reference in its entirety.

BACKGROUND OF THE INVENTION

1. Field of the Invention

The invention relates to a delay locked loop (DLL) circuit for providing an adjustable phase relationship with respect to a periodic input signal.

2. Description of the Related Art

DLL circuits are generally used in integrated circuits to derive a clock signal from a reference clock signal with a particular defined phase relationship. A conventional DLL circuit (as is used, for example, in integrated circuits) has delay elements which are arranged in a row and form a delay chain. A periodic input signal, preferably the reference clock signal, is applied to the input of the first delay element in the delay chain. The delay time of the delay elements can be adjusted on the basis of an item of control information. A phase detector compares the phase relationship of the reference clock signal at the input of the delay chain with that of a signal (which has been phase-shifted with respect to said reference clock signal) at the output of the delay chain, i.e., at the output of the last delay element in the delay chain. If there is a phase difference, an item of control information is generated in order to adjust the delay time of the individual delay elements.

Such a DLL loop is usually adjusted in such a manner that the delay chain gives rise to a phase shift of 180°, with the result that the delay time or the phase shift of each delay element is given by a phase shift of 180° divided by the number of delay elements in the delay chain. The outputs of the delay elements are connected to a selection element which selects one of the outputs of the delay elements on the basis of a selection signal which has been provided and outputs the output from the selected delay element to an output line of the DLL circuit. The selection signal corresponds to a desired phase shift of the input signal with respect to a periodic output signal and specifies the number of delay elements through which the reference clock signal is intended to pass between the input line and the output line of the DLL circuit. If phase shifts of between 180° and 360° are required, the selection element can additionally invert the output signal from the relevant delay element in accordance with the selection signal.

On account of the regulation of the feedback loop, all variations in the process parameters, the operating voltage or the temperature which influence the delay time of the delay elements, insofar as they influence the phase shift of the entire delay chain, are compensated for. However, the DLL circuit usually contains further elements which are not compensated for by regulation and which give rise to an additional delay of the reference clock signal, namely an input buffer for the delay chain, which is provided in order to provide the delay chain with an input signal with a defined driver strength, and the selection element, which likewise has a signal delay. A phase shift of greater than 0° therefore exists between the periodic input signal and the periodic output signal from the DLL circuit even if a desired phase shift of 0° is selected in the selection element.

SUMMARY OF THE INVENTION

It is an object of the present invention to provide a DLL circuit which compensates for the influence of elements (which are not arranged in the feedback circuit) on the phase shift.

The invention provides a DLL circuit for providing an adjustable phase relationship with respect to a periodic input signal. The DLL circuit has controllable delay elements which are connected in series and form a delay chain. Provision is also made of a phase detector which generates a control signal on the basis of the periodic input signal and a periodic signal which has been delayed by the delay chain, the delay of each of the delay elements being adjusted on the basis of the control signal. A selection unit which is respectively connected to an output of the delay elements is used to apply an output signal from one of the delay elements to an output of the DLL circuit on the basis of a selection variable which has been provided. Provision is made of a compensation circuit which modifies the selection signal such that an additional delay (which is caused at least by the selection unit) between the periodic input signal and the output signal from the DLL circuit is compensated for.

The DLL circuit according to the invention makes it possible, by modifying the selection signal, for a desired delay or phase shift of the periodic input signal to be adapted in such a manner that a delay (which is caused by elements other than those in the feedback loop) of the periodic input signal is compensated for.

This is preferably effected with the aid of a compensation circuit which determines a compensation variable, the compensation circuit also having a modification unit in order to modify the selection variable on the basis of the compensation variable.

In particular, the compensation circuit determines the compensation variable by determining the delay time of at least the selection unit in units of the delay time of the delay elements.

In accordance with one preferred embodiment, the compensation circuit has a further selection unit which is connected to the outputs of the delay elements and whose output is connected to a first input of a phase detector. The phase detector generates a further control signal on the basis of the periodic input signal and the output signal from a delay element selected by the further selection unit on the basis of the compensation variable, provision being made of a compensation unit which generates the compensation variable on the basis of the further control signal and applies it to the further selection unit in order to select the output signal from one of the delay elements. This provides a further feedback loop which adjusts the periodic input signal to a periodic signal which has a phase shift of 0° with respect to the periodic input signal. The further feedback loop compensates for the phase shift which results between the periodic input signal and the output signal from the further selection unit by generating a compensation variable. To this end, it is necessary for the further selection unit to essentially have the same delay time as the selection unit. This is preferably achieved by the selection unit and the further selection unit essentially being of the same physical design.

In accordance with another embodiment of the present invention, the compensation circuit may have a calibration circuit in order to determine the compensation variable in a calibration mode and to provide the modification unit with the compensation variable (which has been determined) in a normal operating mode. To this end, the calibration circuit has, in particular, a further phase detector which generates a further control signal on the basis of the periodic input signal and the output signal from a delay element which has been selected, using the selection unit, on the basis of the compensation variable, provision being made of a compensation unit which, in the calibration mode, generates the compensation variable on the basis of the further control signal and applies it to the selection unit in order to select the output signal from one of the delay elements.

In order to provide the modification unit with the compensation variable (which has been determined) in the normal operating mode, the calibration circuit preferably has a memory element.

Provision may also be made of a selection switch which, in the normal operating mode, provides the modification unit with the selection variable on the basis of a calibration mode signal and, in the calibration mode, applies a selection variable to the modification unit, said variable having a value which corresponds to no delay by the delay elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2 shows a DLL circuit having a calibration circuit according to a first embodiment of the invention; and FIG. 3 shows a DLL circuit having a calibration circuit according to another embodiment of the present invention.

DETAILED DESCRIPTION OF THE PREFERRED EMBODIMENT

Figure 1:
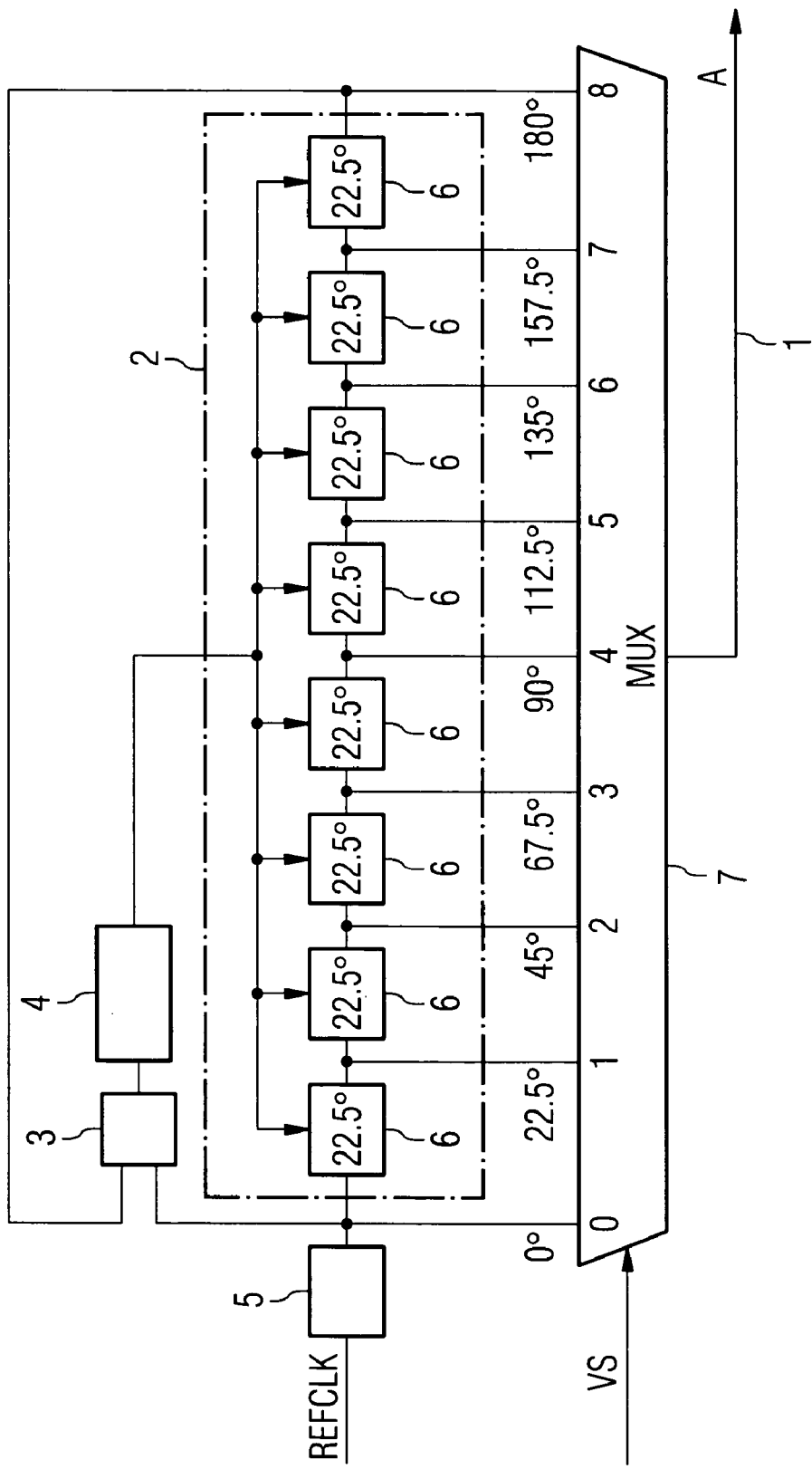
FIG. 1 shows a DLL circuit according to the prior art.

FIG. 1 illustrates a DLL circuit according to the prior art. The DLL circuit is used to shift a periodic input signal (a reference clock signal REFCLK in the present case) in accordance with a prescribed phase shift and to output an output signal A on an output line 1. The DLL circuit may be used, for example, in an integrated circuit in order to apply a clock signal, which is provided at a connection of the integrated circuit, to internal circuits in phase-shifted form or to carry out delay time compensation.

The DLL circuit has a feedback loop having a delay chain 2, a phase detector 3 and a loop filter 4. The reference clock signal REFCLK is applied to an input of the delay chain 2 via an input buffer 5. The input buffer 5 is used to apply the periodic input signal with a predetermined driver strength to the input of the delay chain. The reference clock signal which is driven through the input buffer 5 is likewise applied to a first input of the phase detector 3. An output of the delay chain 2 is also connected to a second input of the phase detector 3. An output of the phase detector 3 provides a control signal which is connected to an input of the loop filter 4.

The delay chain 2 has delay elements 6 which are connected in series, and each delay element has an input, an output and a control input. The inputs and outputs of the delay elements 6 are connected in series, and the delay elements each delay the signal which is applied to their input. The control inputs of the delay elements are jointly connected to an output of the loop filter 4, at which the filtered control signal is output from the phase detector 3.

The loop filter 4 is essentially used to avoid oscillation of the feedback loop in order to avoid sudden changes by a value which can be adjusted, particularly in the case of delay elements which can be adjusted digitally or discretely.

The feedback loop formed by the delay chain 2, the phase detector 3 and the loop filter 4 is adjusted, depending on the phase detector used, in such a manner that the added delay times of each of the delay elements 6 delay the delay chain 2 by 180°. That is to say the signal which is taken from the output of the delay chain 2 and is applied to the second input of the phase detector 3 has been phase-shifted through 180° with respect to the amplified reference clock signal REFCLK.

The number of delay elements 6 in the delay chain 2 is not restricted to eight, as in the example given; it is expedient to select the number of delay elements to be as large as possible so that the best possible resolution is achieved when selecting the phase shift. Furthermore, depending on the phase detector 3 used, it is also possible to provide a delay chain for a delay of the input signal by 360°, the phase detector 3 determining, in this case, whether the input signal leads or lags the output signal from the delay chain.

Provision is also made of a selection unit 7 which may be in the form of a multiplexer, for example. The selection unit 7 has inputs which are directly connected to both the output of the input buffer 5 and the outputs of the individual delay elements in the delay chain 2. In accordance with a delay signal VS which specifies the desired phase shift, the selection unit 7 selects one of the inputs in order to connect it to the output line 1. The delay signal VS is prescribed and thus represents a selection signal for the selection unit 7 in order to select one of the outputs of the delay elements 6 which corresponds to a particular phase shift of the reference clock signal REFCLK. Since the number of delay elements 6 in the delay chain 2 is known, and it is also known that, in the steady state, the feedback loop adjusts the delay of the delay chain 2 to a phase shift of exactly 180°, the phase shift caused by a delay element can be determined to be 180° divided by the number of delay elements 6 in the delay chain 2. In accordance with the delay signal VS, the reference clock signal which has been delayed using none of the delay elements or a particular number of delay elements 6 is now selected and output to the output line 1 as an output signal A. In the present example, a total of eight delay elements 6 are provided for the entire delay chain 2, with the result that a phase shift of 22.5° results for each of the delay elements. If a phase shift of 45° is to be achieved between the reference clock signal REFCLK and the output signal A, the output of the second delay element needs to be connected to the output line 1 via the selection unit 7, and the delay signal VS needs to be correspondingly selected. The selection unit 7 may also have an inverter unit (not shown) in order to invert the signal which has been switched through to the output line 1, thus making it possible to realize phase shifts of between 180° and 360°. This is preferably likewise prescribed by the delay signal VS.

Whereas process-dictated influences on the delay time of the delay elements and influences which are dependent on the supply voltage and on the temperature are compensated for in the feedback loop, the signal delays within the selection unit 7 and within the input buffer 5 are not compensated for by the feedback loop. A corresponding additional signal delay which is given by the signal delays of the selection unit 7 and of the input buffer 5 is thus always applied to the phase shift between the periodic input signal of the DLL circuit and the output signal from the DLL circuit. Since this may result in different additional phase shifts in the case of a variable frequency of the periodic input signal, it is desirable to minimize or eliminate these influences as far as possible.

To this end, FIG. 2 provides a first embodiment of a DLL circuit according to the invention. In that figure, identical reference symbols correspond to elements having identical or comparable functions as those in FIG. 1.

In order to compensate for the phase shift which is caused by the selection unit 7 and the input buffer 5, the embodiment shown in FIG. 2 has a modification circuit 8 which modifies the delay signal VS in accordance with a compensation signal AS and applies a modified delay signal VS' to the selection unit 7. To this end, provision is made of a further selection unit 9 which is essentially of the same physical design as the selection unit 7 and has the same signal delay time as the selection unit 7. An output of the further selection unit 9 is connected to a first input of a further phase detector 10, and a second input of the further phase detector 10 is connected to the reference clock signal REFCLK upstream of the input buffer 5. An output of the further phase detector 10 is connected to a compensation unit 11 which generates the compensation signal AS and provides both the modification circuit 8 and the further selection unit 9 with said compensation signal. This compensation signal AS is adjusted, using the feedback loop which is formed by the further phase detector 10, the compensation unit 11 and the further selection unit 9, in such a manner that the delay of the further selection unit 9 and of the input buffer 5 is essentially compensated for in units of the adjusted delay times of the delay elements 6. That is to say the delay time between the input of the input buffer 5 and the output of the further selection unit 9, said delay time corresponding to the delay time between the input of the input buffer 5 and the output of the selection unit 7, is determined without the influence of the delay chain 2 and is expressed by the compensation signal AS as a factor of the delay time of a delay element 6. If, for example, the signal delay which is caused by the input buffer 5 and the further selection unit 9 corresponds to 67.5°, the compensation signal obtained is a compensation variable to the value of "−3", thus making it possible to compensate for the signal delays of 67.5° using a signal delay of "−67.5°". In the exemplary embodiment illustrated, the modification circuit 8 essentially represents a subtraction circuit in which the compensation signal AS is subtracted from the prescribed delay signal VS in order to obtain the modified delay signal VS'. The delay signal VS and the compensation signal AS may represent both digital signals and analog signals in the form of voltages and preferably specify the corresponding delays of the number of delay elements.

If, for example, a phase shift of 90° is to be achieved between the input signal and the output signal in the DLL circuit, the delay signal VS, in the exemplary embodiment illustrated in FIG. 2, specifies a value which determines that the output of the fourth delay element 6 in the delay chain 2 is connected to the output line 1. If the further feedback loop which is formed from the further selection unit 9, the further phase detector 10 and the compensation unit 11 is used to determine that the phase shift between the input signal and the output signal corresponds to approximately 45° given an assumed set phase shift of 0°, a phase shift of 135° between the input signal and the output signal would result in the DLL circuit according to the prior art since the signal delay times in the selection unit 7 and the input buffer 5 cannot be compensated for by the feedback loop. The further feedback loop now determines a compensation signal AS which is calculated in the modification circuit 8, using the delay signal VS, in such a manner that the number of delay elements through which the input signal passes before it is applied to the output line 1 is reduced, to be precise by a value which corresponds to the phase shift of 45° which is caused by the selection unit 7 and the input buffer 5. The phase shift of 45° may essentially be compensated for using two delay elements 6, with the result that, in the abovementioned example, the output of the second delay element is connected to the output line 1 instead of the output of the fourth delay element in order to obtain the desired phase shift of 90°.

FIG. 3 shows an alternative embodiment of the invention. In this case too, identical reference symbols correspond to identical elements having an identical or comparable function as those in FIGS. 1 and 2. Instead of a further selection unit, the selection unit 7 is used both to output the output signal and to determine the compensation signal AS. To this end, use is made of a calibration circuit which can be operated in two operating modes. In a calibration mode, the phase shift caused by the input buffer 5 and the selection unit 7 is first of all determined and a corresponding compensation variable AS is provided. This compensation variable is stored, and the compensation circuit 8 is provided with said compensation variable in the normal operating mode. To this end, the output of the selection unit 7 is essentially connected to a first input of a further phase detector 20. A second input of the phase detector 20 is connected to the reference clock signal REFCLK as input signal. An output of the phase detector is connected to a compensation unit 21. The compensation unit 21 receives a mode signal MS which specifies whether a calibration mode or a normal operating mode is to be assumed. In the calibration mode, which is indicated by the mode signal MS, the compensation unit 21 determines the compensation variable and stores it in the memory unit 22.

If the mode signal MS indicates the normal operating mode, the modification circuit 8 is provided with the compensation variable which is stored in the memory unit 22. Furthermore, a switching device 23 which may be in the form of a multiplexer, for example, provides the modification circuit 8 with a calibration variable in the calibration mode, said calibration variable specifying that the input signal is to be applied, by the delay chain 2, to the output of the DLL circuit with as little delay as possible, that is to say the output of the input buffer 5 is applied to the output line 1 via the selection unit 7. In the normal operating mode, the delay signal VS which is applied to a second input of the switching device 23 is applied to the modification circuit 8, with the result that a modified delay signal VS' is applied to the selection unit 7 on the basis of the delay signal VS and the compensation signal AS.

The embodiment shown in FIG. 2 essentially differs from the embodiment shown in FIG. 3 by virtue of the fact that, in the last-mentioned embodiment, the further selection element 9 may be dispensed with and, instead, in two operating modes, the compensation variable AS is first of all determined and the compensation variable determined is then used to modify the delay signal in the modification circuit 8.

The invention makes it possible, in a DLL circuit, to also take into account the components which are used independently of the feedback loop, such as the selection unit 7

(multiplexer) and the input buffer 5 which is connected upstream of the feedback loop, with the result that the phase shift between the periodic input signal and the phase-shifted output signal can be exactly adjusted to the value specified by the delay signal VS.

The features of the various embodiments may be combined with one another in any desired manner—provided that they do not technically exclude one another in an obvious manner—without departing from the field of the present invention.

While the foregoing is directed to embodiments of the present invention, other and further embodiments of the invention may be devised without departing from the basic scope thereof, and the scope thereof is determined by the claims that follow.

What is claimed is:

1. A delay locked loop (DLL) circuit for providing an adjustable time delay of a periodic input signal, comprising:
    a plurality of controllable delay elements, each delay element comprising a first input, a first output, and a control input, wherein the first inputs and the first outputs of the delay elements are connected in series to form a delay chain, the delay chain comprising a second input, the second input being the first input of a first delay element of the delay chain, and a second output, the second output being the first output of a last element of the delay chain;
    a phase detector connected to the second input and the second output, wherein the phase detector is configured to generate a control signal based on the periodic input signal and a delayed signal which has been delayed by the delay chain, the delay of each of the delay elements being adjusted via the respective control input coupled to the phase detector based on the control signal;
    a selection unit having inputs which are respectively connected to the respective outputs of the delay elements in the delay chain, wherein the selection unit is configured to select, based on a selection variable applied to the selection unit, an output signal from one of the delay elements as an output of the DLL circuit; and
    a compensation circuit configured to compensate for additional delay, which is additional to the delay provided by the delay elements, between the periodic input signal and the output signal from the DLL circuit and which is caused at least by the selection unit, wherein the compensation circuit modifies the selection variable provided to the selection unit to select the output signal.

2. The DLL circuit of claim 1, wherein the compensation circuit determines a compensation variable, the compensation circuit comprising a modification unit configured to modify the selection variable with the compensation variable.

3. The DLL circuit of claim 2, wherein the compensation circuit determines the compensation variable by determining a delay time associated with at least the selection unit in units corresponding to respective delay times of the delay elements.

4. The DLL circuit of claim 2, further comprising:
    a second selection unit connected to the outputs of the delay elements;
    a second phase detector connected to receive an output of the second selection unit, the second phase detector configured to generate a second control signal based on the periodic input signal and an output signal of the second selection unit; and
    a compensation unit configured to generate the compensation variable based on the second control signal and to apply the second control signal to the second selection unit to select the output signal from one of the delay elements.

5. The DLL circuit of claim 4, wherein the selection unit and the second selection unit have substantially same physical designs.

6. The DLL circuit of claim 2, wherein the compensation circuit further comprises a calibration circuit configured to determine the compensation variable in a calibration mode and to provide the modification unit with the compensation variable in a normal operating mode.

7. The DLL circuit of claim 6, wherein the calibration circuit comprises:
    a second phase detector configured to generate a second control signal based on the periodic input signal and the output signal from the selection unit in the calibration mode; and
    a compensation unit which, in the calibration mode, generates the compensation variable based on the second control signal and in the normal operating mode, provides the compensation variable to the modification unit.

8. The DLL circuit of claim 7, wherein the calibration circuit has a memory element for storing the compensation variable which is provided to the modification unit in the normal operating mode.

9. The DLL circuit of claim 8, wherein the compensation circuit further comprises a selection switch controlled by a mode selection signal, wherein the selection switch, in the normal operating mode, provides the modification unit with the selection variable in unchanged form and, in the calibration mode, applies a calibration variable to the modification unit, the calibration variable having a value which corresponds to no delay.

10. A method for providing an adjustable time delay of a periodic input signal, comprising:
    providing a DLL circuit comprising a delay chain connected to receive the periodic input signal, the delay chain comprising a plurality of controllable delay elements, each delay element comprising a first input, a first output, and a control input, the first inputs and first outputs of the delay elements being connected in series, the delay chain comprising a second input, the second input being the first input of a first delay element of the delay chain, and a second output, the second output being the output of the first output of a last delay element of the delay chain;
    generating a control signal based on the periodic input signal and a delayed signal which has been delayed by the delay chain, the delay of each of the delay elements being adjusted based on the control signal, wherein the control signal is generated utilizing a phase detector connected to the second input and the second output and is provided via the respective control input coupled to the phase detector;
    selecting, by a selection unit connected to receive a selection variable, an output signal from one of the delay elements as an output of the DLL circuit, wherein the selection unit includes inputs which are respectively connected to the respective outputs of the delay elements in the delay; and
    modifying the selection variable provided to the selection unit to compensate for additional delay, which are additional to the delay provided by the delay elements, between the periodic input signal and the output signal from the DLL circuit and which is caused at least by the selection unit.

11. The method of claim 10, further comprising:
determining a compensation variable utilizing a compensation circuit, wherein the selection variable is modified with the compensation variable determined by the compensation circuit.

12. The method of claim 11, further comprising:
selecting between a calibration mode and a normal operation mode, wherein the compensation variable is determined in the calibration mode and wherein the compensation variable is provided to a modification unit for modifying the selection variable in the normal operation mode.

13. The method of claim 12, further comprising:
storing the determined compensation variable in a memory in the compensation circuit.

14. A delay locked loop (DLL) circuit for providing an adjustable time delay of a periodic input signal, comprising:
a delay chain connected to receive the periodic input signal, the delay chain comprising a plurality of controllable delay elements, each delay element comprising a first input, a first output, and a control input, the first inputs and first outputs of the delay elements being connected in series, the delay chain comprising a second input, the second input being the first input of a first delay element of the delay chain, and a second output, the second output being the output of the first output of a last delay element of the delay chain;
a phase detector connected to the second input and the second output, wherein the phase detector is configured to generate a control signal based on the periodic input signal and a delayed signal which has been delayed by the delay chain, the delay of each of the delay elements being adjusted via the respective control input coupled to the phase detector based on the control signal;
a selection unit having inputs connected to receive the periodic input signal and to respective outputs of the delay elements, the selection unit configured to select, based on a selection variable, one of the inputs which is provided as an output signal of the DLL circuit; and
a compensation circuit configured to compensate for additional delay, which is additional to the delay provided by the delay elements, between the periodic input signal and the output signal from the DLL circuit and which is caused at least by the selection unit, wherein the compensation circuit modifies the selection variable provided to the selection unit to select the output signal.

15. The DLL circuit of claim 14, wherein the compensation circuit comprises a modification unit configured to modify the selection variable with a compensation variable determined by the compensation circuit.

16. The DLL circuit of claim 15, wherein the compensation circuit determines the compensation variable by determining a delay time associated with at least the selection unit in units corresponding to a delay time of one delay element.

17. The DLL circuit of claim 15, further comprising an input buffer connected to receive the periodic input signal and to provide the periodic input signal to the delay chain and the selection unit, respectively, and wherein the compensation circuit determines the compensation variable by determining a delay time associated with at least one of the input buffer and the selection unit in units corresponding to a delay time of one delay element.

18. The DLL circuit of claim 17, wherein the compensation circuit comprises:
a second selection unit having inputs connected to receive the periodic input signal from the input buffer and to respective outputs of the delay elements; and
a second phase detector connected to determine a phase difference between the periodic input signal and an output signal of the second selection unit, wherein the compensation circuit determines the compensation variable based on the phase difference determined by the second phase detector.

19. The DLL circuit of claim 17, further comprising:
a second phase detector connected to determine a phase difference between the periodic input signal and an output signal of the selection unit;
wherein the compensation circuit controlled by a mode selection signal and is selectable between a calibration mode and a normal operation mode, wherein the compensation variable is determined, in the calibration mode, based on the phase difference determined by the second phase detector and stored in a memory of the compensation circuit, and wherein the stored compensation variable is provided to the modification unit for modifying the selection variable in the normal operation mode.

20. The DLL circuit of claim 19, further comprising:
a switching device controlled by the mode selection signal, wherein the switch device, in the normal operating mode, provides the modification unit with the selection variable in unchanged form and, in the calibration mode, applies a calibration variable to the modification unit, the calibration variable having a value which corresponds to no delay.

* * * * *